(12) United States Patent
Damodaran et al.

(10) Patent No.: US 7,325,178 B2
(45) Date of Patent: Jan. 29, 2008

(54) PROGRAMMABLE BUILT IN SELF TEST OF MEMORY

(75) Inventors: Raguram Damodaran, Plano, TX (US); Timothy D. Anderson, Dallas, TX (US); Sanjive Agarwala, Richardson, TX (US); Joel J. Graber, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 222 days.

(21) Appl. No.: 11/003,206

(22) Filed: Dec. 3, 2004

(65) Prior Publication Data

US 2005/0172180 A1 Aug. 4, 2005

Related U.S. Application Data

(60) Provisional application No. 60/527,310, filed on Dec. 5, 2003.

(51) Int. Cl.
*G11C 29/00* (2006.01)
*G11C 7/00* (2006.01)

(52) U.S. Cl. ..................... 714/718; 365/201
(58) Field of Classification Search ................ 714/718
See application file for complete search history.

(56) References Cited

U.S. PATENT DOCUMENTS

| | | | | |
|---|---|---|---|---|
| 4,313,200 A | * | 1/1982 | Nishiura | 714/736 |
| 5,157,664 A | * | 10/1992 | Waite | 714/710 |
| 5,640,509 A | * | 6/1997 | Balmer et al. | 714/42 |
| 6,321,320 B1 | * | 11/2001 | Fleischman et al. | 711/217 |
| 6,560,740 B1 | * | 5/2003 | Zuraski et al. | 714/733 |
| 6,622,269 B1 | * | 9/2003 | Ngo et al. | 714/718 |
| 6,769,081 B1 | * | 7/2004 | Parulkar | 714/733 |
| 2002/0108073 A1 | * | 8/2002 | Hughes | 714/7 |
| 2002/0194545 A1 | * | 12/2002 | Abbott | 714/42 |
| 2003/0084389 A1 | * | 5/2003 | Kottapalli et al. | 714/733 |
| 2004/0025095 A1 | * | 2/2004 | Nemani et al. | 714/710 |
| 2004/0103355 A1 | * | 5/2004 | Correale et al. | 714/733 |
| 2005/0047229 A1 | * | 3/2005 | Nadeau-Dostie et al. | 365/201 |

* cited by examiner

*Primary Examiner*—Cynthia Britt
(74) *Attorney, Agent, or Firm*—Robert D. Marshall, Jr.; W. James Brady; Frederick J. Telecky, Jr.

(57) ABSTRACT

The pBIST solution to memory testing is a balanced hardware-software oriented solution. pBIST hardware provides access to all memories and other such logic (e.g. register files) in pipelined logic allowing back-to-back accesses. The approach then gives the user access to this logic through CPU-like logic in which the programmer can code any algorithm to target any memory testing technique required. Because hardware inside the chip is used at-speed, the full device speed capabilities are available. CPU-like hardware can be programmed and algorithms can be developed and executed after tape-out and while testing on devices in chip form is in process.

5 Claims, 10 Drawing Sheets

PROGRAMMABLE BUILT IN SELF TEST OF MEMORY

This application claims priority under 35 USC §119(e)(1) of Provisional Application No. 60/527,310 (TI-36126PS), filed Dec. 5, 2003.

TECHNICAL FIELD OF THE INVENTION

The technical field of this invention is manufacture memory testing.

BACKGROUND OF THE INVENTION

In conventional VLSI systems memory testing is done in three essential steps. In the first step, hardwired logic employs algorithms developed before the device is committed to tape-out. These are often available through third-party vendors, examples are memBIST, MSIST. Deciding on the detailed make-up of hardwired logic is not feasible because it is impossible to predict the necessary information derived from process model during the process qualification window. In the second step, conventional memory testing attempts to close testing gaps using central processing unit (CPU) based approaches. These have a number of limitations. The major limitation is that there may be memory functions largely inaccessible via a CPU interface. Another severe limitation is the inability to do back-to-back accesses to all memories. The third step uses DMA external memory accesses while the device is in wafer form. Such DMA external memory accesses cannot be accomplished at full processor speed. Thus a significant number of failures are not observable.

FIG. 1 illustrates a conventional memory built-in-self-test (BIST) block diagram. The core functions are: (1) the BIST controller state machine 101 made up of hard-wired logic; and (2) the BIST data logger 102. The BIST controller 101 communicates with the BIST data logger 102 via bus 115 and supplies stimulus to multiple RAMs under test 103 via multiple buses 110. BIST data logger 102 accumulates the test results via multiple buses 111 and passes them to an external interface via bus 113. BIST data logger 102 compares expected results 114 received via bus 112 with return read data from the multiple RAMs 103 received via bus 111.

Major difficulties with conventional BIST memory test systems include:

1. Test algorithms must be hard wired into the BIST controller state machine 101;
2. Multiple RAMS must be driven with stimulus and results must be extracted from these multiple RAMs requiring complex interconnect paths;
3. Back-to-back memory access to all memories are not feasible; and
4. Memories cannot be tested at speed while in wafer form.

These and other problems with the prior art provide a need for a new kind of memory testing.

SUMMARY OF THE INVENTION

The pBIST (programmable built-in-self-test) memory testing of this invention is a combined hardware and software solution. pBIST hardware provides access to all memories and other such logic such as register files in pipelined logic allowing back-to-back accesses. The pBIST technique gives the user access to this logic through CPU-like logic. The user can program the pBIST hardware to employ any algorithm to target any memory in any memory testing technique required. Because hardware inside the chip is used at-speed, the full device speed capabilities are available. CPU-like hardware can be programmed and algorithms can be developed and executed after tape-out and while testing on devices in chip form.

BRIEF DESCRIPTION OF THE DRAWINGS

These and other aspects of this invention are illustrated in the drawings, in which.

DETAILED DESCRIPTION OF PREFERRED EMBODIMENTS

Programmable Built-In Self Test (pBIST) performs memory self test using a coherent hardware-to-software interface allowing hardware access to testing logic at-speed with software controlling the detailed manner of testing. Devices employing conventional testing techniques such as memBIST and MBIST are committed to hardware solutions without programmable capabilities for modifying algorithms that are found inefficient after tape-out. All revisions of the chip must have a corrected test algorithm. CPU BIST and software BIST memory testing also have number of deficiencies. First, CPUs will not ordinarily have access to all memories. Providing such an interface increases the device cost. CPU functionality must be proved before memory testing can begin. The CPU BIST technique is slow and costly to develop because an expert device designer with thorough knowledge of the CPU must program the CPU to perform the testing. The CPU may not have back-to-back access capability to all memory-like logic. Wafer DMA or external BIST techniques are I/O speed limited and hence very slow. Dynamic memory failures like pre-charge and speed failures cannot be detected except at full device speed. The pBIST solution of this invention addresses all of these issues with considerably less logic than any competing techniques.

pBIST renders unnecessary the need to identify and deal with all memory failure issues and algorithms before tape-out. Using pBIST one can employ process qualifiers and processing on other devices with the advantage of making changes to testing techniques after tape-out when desired. Because the CPU-like logic is powerful, all useful comprehended algorithms are within the pBIST capabilities.

During activation of only a small portion of the chip, only the pBIST logic and the path to and from the memories, needs to be functional to validate the memories. This obviates the need for verifying in advance that the full CPU is functional. pBIST allows operation both from a programming logic interface as well as the from the CPU interface. This permits maximum flexibility. pBIST has two logging features: (a) Failure-only logging technique; and (b) Stream-out capability. Both are invaluable for failure analysis.

Figure 1:
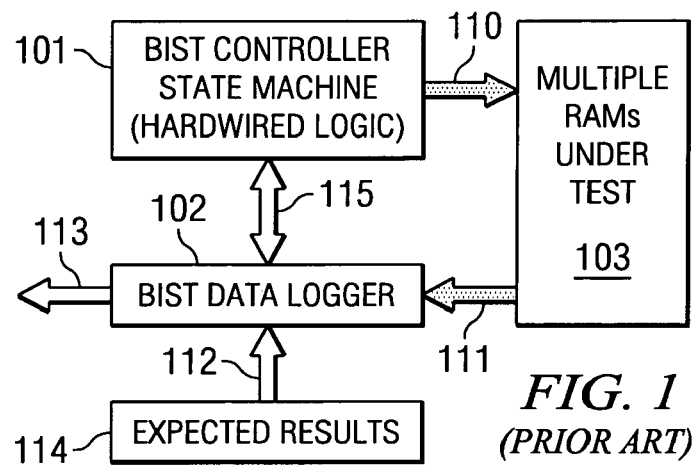
FIG. 1 illustrates conventional BIST architecture for memory testing (Prior Art)
Figure 2:
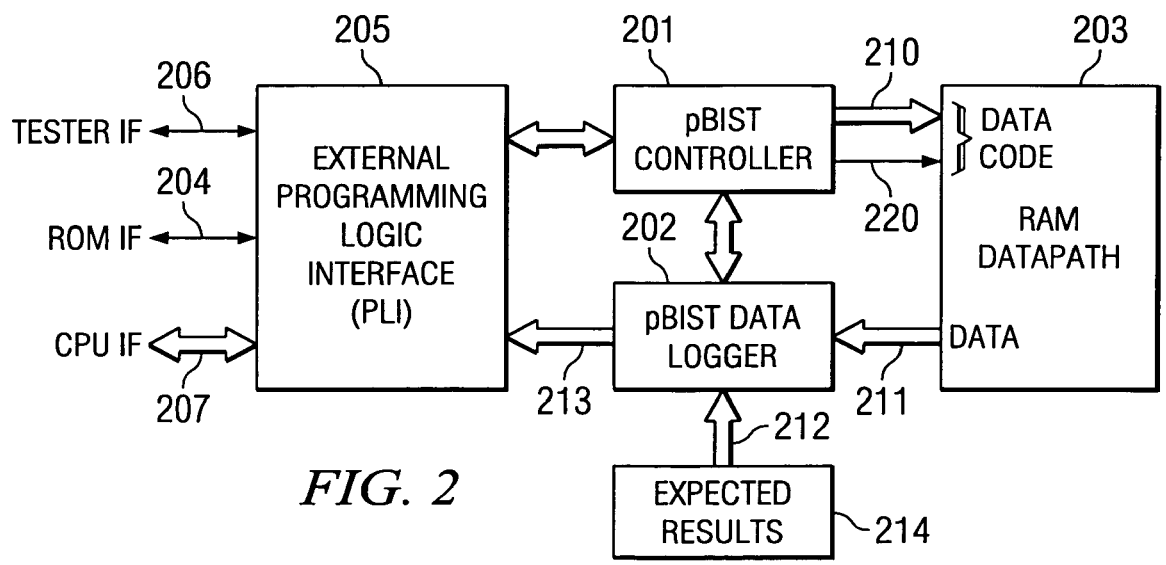
FIG. 2 illustrates the pBIST architecture block diagram.

FIG. 2 illustrates the pBIST architecture. pBIST has two main functional units. These are the pBIST controller 201 and the pBIST data-logger 202. The PBIST controller 201 includes programmable logic that functions as a limited capability CPU and performs the memory stimulus. The pBIST data logger 202 compares the results from RAM datapath 203 with the expected results 214 from bus 212 and passes the comparison results to the external programming logic interface block 205 via bus 213. At the tester interface 206, the status of the memory testing as requested by the programmer is available. The external interface block 205 provides a CPU core interface bus 207 for configuration of the testing through the path provided by the CPU on the chip under test giving further leverage to the configuration task. A ROM interface 204 provides additional testing flexibility. RAM datapath block 203 provides the test interface to the multiple embedded RAMs under test and this includes:

1. Driving data 210 and instructions from pBIST controller 201. A single bus 210 allows stimulus to be broadcast to all RAMs. A code signal 220 accompanying bus 210 signals to the target RAM that it is receiving data.

2. Output data on bus 211 (results of the test) is sent to pBIST data logger 202. The code signal 220 also identifies the RAM providing the return data source.

The crucial requirement of the RAM datapath block 203 addressed by the pBIST approach is that its presence does not significantly degrade the memory performance in normal use. Reducing the required bus complexity of busses 210 and 211 using the coding scheme of signal 220 is a key to reducing complexity.

Figure 3A:
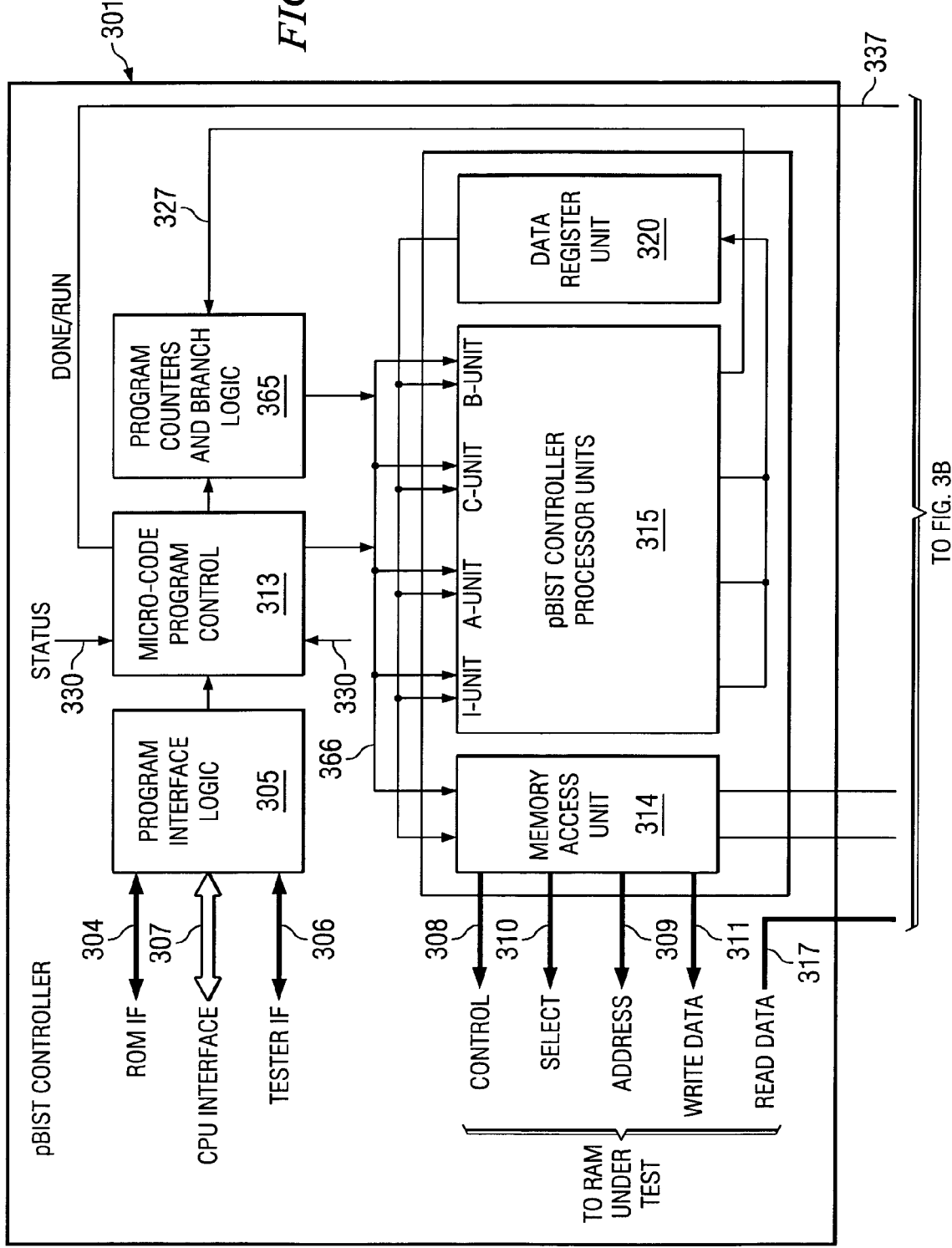
FIGS. 3A and 3B together illustrate the interconnection diagram of the pBIST controller, pBIST data logger and interface.
Figure 3B:
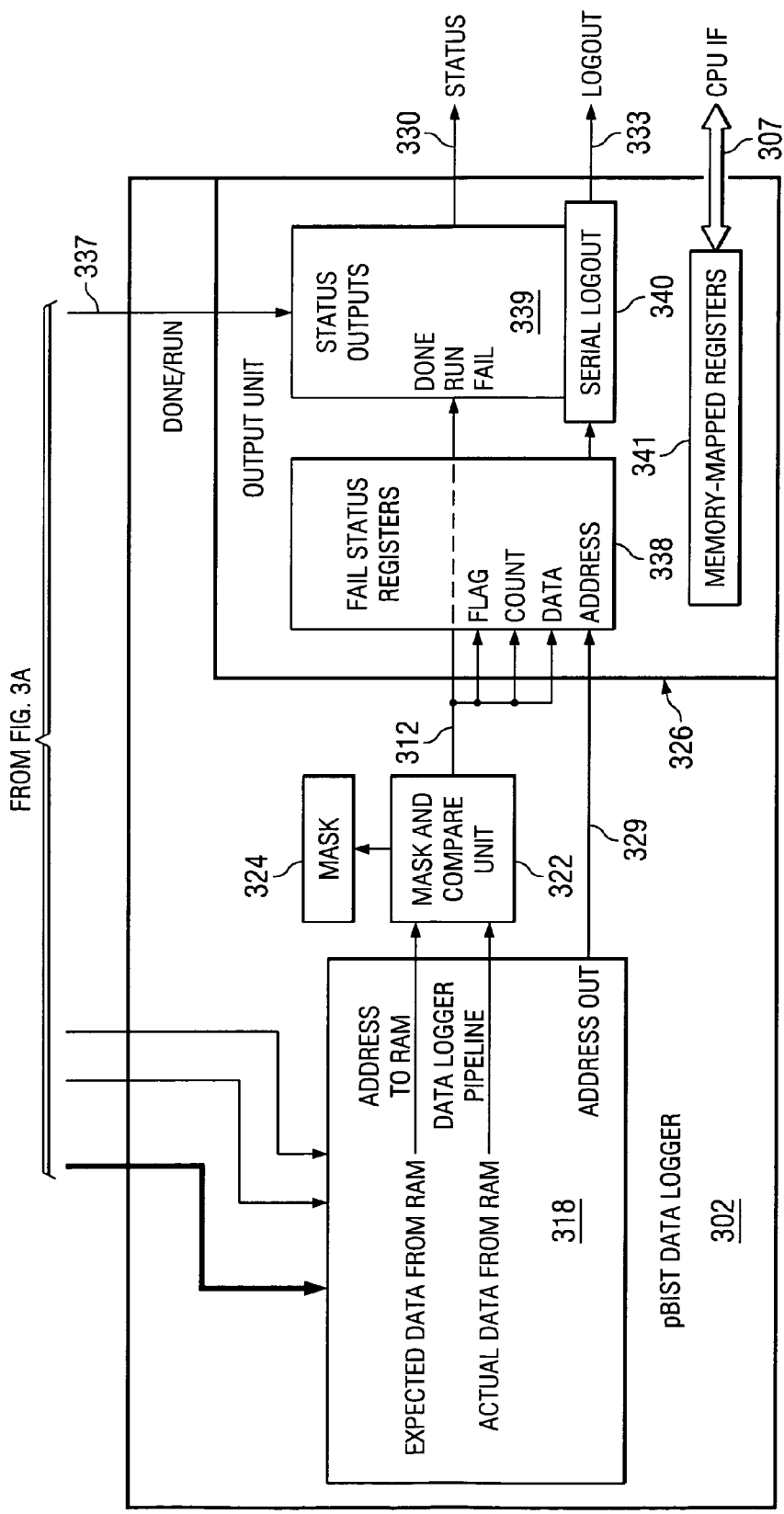

FIG. 3 illustrates the interconnection of the pBIST controller 301 and pBIST data logger 302. The pBIST architecture includes program interface logic 305 and a microcode program control 313. The program interface logic 305 includes configuration registers loaded through CPU interface bus 307. Expensive, powerful test machines are rendered unnecessary for pBIST testing using a very low cost tester interface 306. The microcode program control 313 stores all user-programming inputs entered via CPU interface bus 307. The microcode program control 313 provides the memory access unit 314 with all new control and data information to drive the embedded RAM under test. This information includes control 308, address 309, select 310 and write data 311 for the up-coming clock cycle. The pBIST microcode program control 313 also drives functional processor units within the pBIST controller processor units 315.

The data registers unit 320 receives outputs from three of the functional units within the pBIST controller processor units 315: I-unit, A-unit, and C-unit. The I-unit, A-unit, C-unit are thus provided with two operands, (a) current operands from the microcode program control 313 and (b) next state operands, from the data register unit 320. Similarly the memory access unit 314 is also provided with two operands, (a) current operands from the microcode program control 313 and (b) next state operands, from the data register unit 320.

The program counters and branch logic 365 draws special emphasis to the role of the B-Unit in forming the instructions at bus 366. Instructions 366 can proceed from a direct path from microcode program control 313 or from a branch route directed by the B-Unit.

The data register unit 320 holds all memory mapped register data, which includes:

Address Registers:

(1) Constant Registers CA0 and CA1. These are 16 bits wide and may be modified only by initialization and external load operations. They cannot be incremented or decremented. CA0 and CA1 are assigned memory-mapped address 00A0 and 00A4 respectively in Table 5 below.

(2) Variable Registers A0 and A1. These are 16 bits wide and they can be initialized, incremented or decremented and cleared. A0 and A1 are assigned memory-mapped address 0080 and 0084 respectively in Table 5 below.

(3) Loop Count Registers include constants: CL0 and CL1. These are 16 bits wide and may be modified only by initialization and external load operations. They cannot be incremented or decremented. CL0 and CL1 are assigned memory-mapped address 00A8 and 00AC respectively in Table 5 below.

(4) Variable Registers L0 and L1. These are 16 bits wide and can be initialized, incremented or decremented and cleared. L0 and L1 are assigned memory-mapped address 0088 and 008C respectively in Table 5 below.

Data Registers:

(5) Constants D1, D0, and E1, E0, each of which is 32 bits wide and may be modified by initialization, C-unit and external load operations. They cannot be incremented or decremented. D0 and D1 are assigned memory-mapped address 0090 in Table 5 below. E0 and E1 are assigned memory-mapped address 0094 in Table 5 below.

(6) The increment registers including constants I0 and I1. These registers are 16 bits wide and may be modified only by initialization and external load operations. They cannot be incremented or decremented. I0 and I1 are assigned memory-mapped addresses 00B0 and 00B4 respectively in Table 5 below.

The memory access unit 314 passes to the pBIST data logger 302 the following:

(a) expected results information (write data 311), and (b) address information (address 309) to the pBIST data logger input registers pipeline 318. Actual results, read data 317 directly from the RAM under test also passes to data logger pipeline 318 for comparison in mask and compare unit 322. Compare results may be masked in the mask and compare unit 322 using mask 324 before being passed to the pBIST data logger output unit registers 326. Address information is tracked in the data logger via signal 329. Mask features include: (a) data width, (b) column fail, and (c) time stamp. Data Logger Outputs include: Done, Fail, and Run status outputs 330 and Logout 333. The CPU IF 307 interfaces with the memory mapped registers 341. The data logger output unit 326 includes the status registers 338, status output logic 339, the memory mapped registers 341, and serial logout via serial logout 340. Further description of the pBIST data logger is given below in FIGS. 7, 8, and 9.

Figure 4:
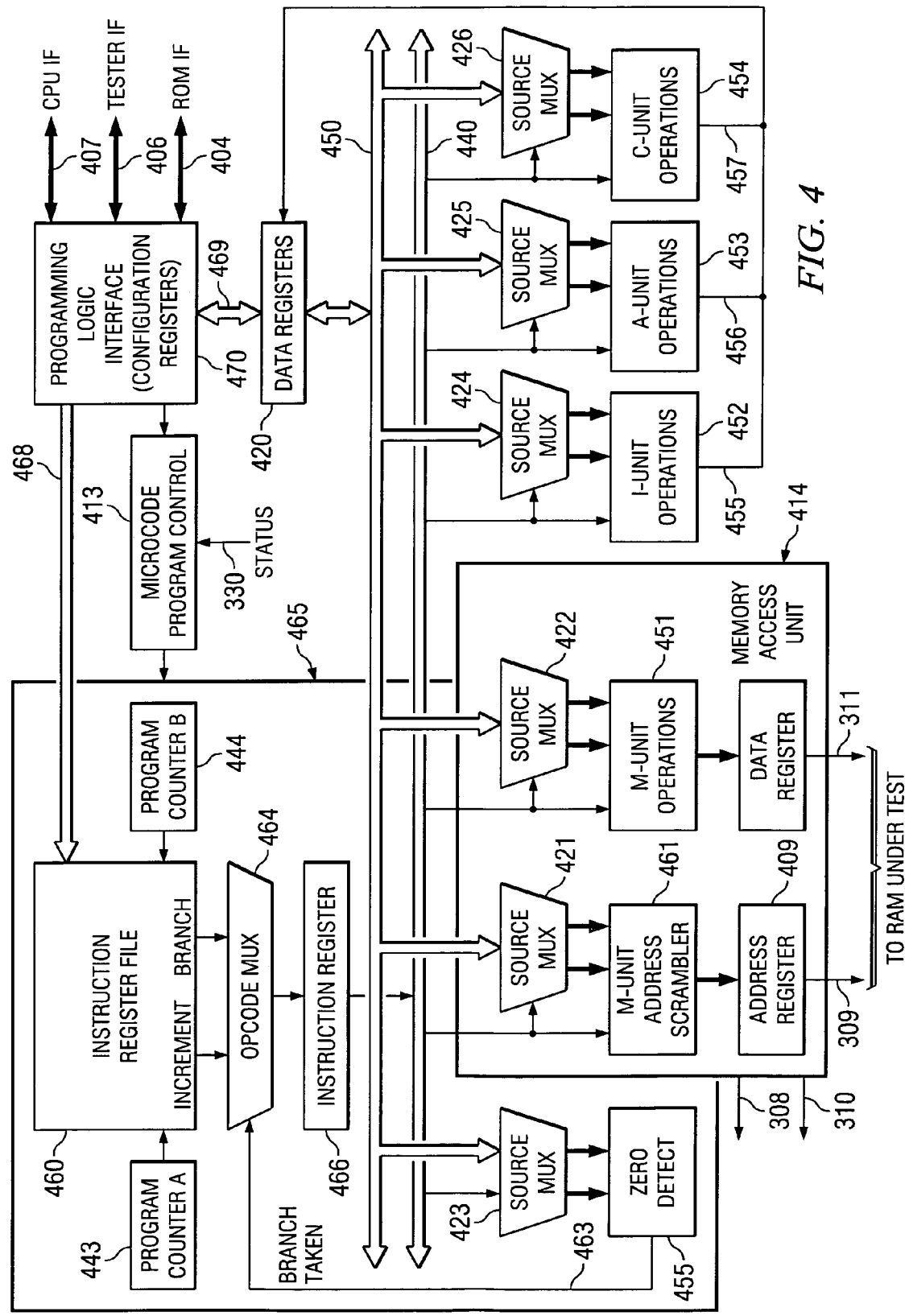
FIG. 4 illustrates a lower level diagram of the pBIST microcontroller hardware.

FIG. 4 illustrates a lower level diagram of the pBIST controller 301 hardware of FIG. 3. The pBIST controller includes a microcode program control unit 413. The microcode program control unit 413 stores all user-programming inputs entered into the programming logic interface unit 470 via paths: CPU IF 407; ROM IF 404; and tester IF 406.

Status information from each processor unit is also passed to the microcode program control unit 413 via status input 330 from the data logger 302 of FIG. 3. The CPU IF 407 provides all data information and all control and address information to drive the embedded RAM under test via its path 468 to the instruction register file 460 and to the data registers 420 via path 469. The data registers in turn feed the main data bus 450. Main data bus information includes control and data output signals: control 308; address 309; select 310; and write data 311 all of which are current for the up-coming clock cycle. The pBIST instruction register file 460 drives, via bus 440, the functional processor units within the pBIST including: M-unit 451, I-unit 452, A-unit 453, C-unit 454, B-unit 465, zero detect unit 455, and address scrambler unit 461. The data registers 420 receives the destination addresses 455, 456, and 457 from the I-unit 452, the A-unit 453, and the C-unit 454 respectively. These destination addresses are passed from the data registers 420 to the main bus 450. Four functional units within the pBIST controller processor units: I-unit, A-unit, C-unit, and B-unit are thus provided with operand addresses from which the subsequent address and control inputs are computed in the memory access unit 414.

The Branch-unit 465 performs tests on source addresses and generates instructions that are passed to the instruction bus 440. The branch unit 465 performs the comparisons and tests using program counter A 443 and program counter B 444 states as additional inputs. Opcode MUX 464 selects and instruction register 466 stores the results of the comparisons and supplies instructions to the instruction bus 440.

The data registers 420 forms a holding register stage for each of the parameters distributed by the main bus. These are: A0, A1, L0, L1, D0, D1, I0, I1, E0, and E1 and they are described in the list of memory-mapped registers in Table 5.

pBIST logic supports a compact set of instructions that allow a user to perform memory testing. The primary assumption is that pBIST can be completely initialized to any state and then enabled to execute the required limited set of instructions. The preferred pBIST design can execute as many as 32 separate instructions. This is more than sufficient for most of the testing found necessary in designs in process or contemplated. The pBIST logic can be configured in two steps:

1. Set maximum hardware requirements through specified parameter in a software RTL. Parameters including, the number of entries and the maximum pipeline latency, for example, are defined below.

Figure 5:
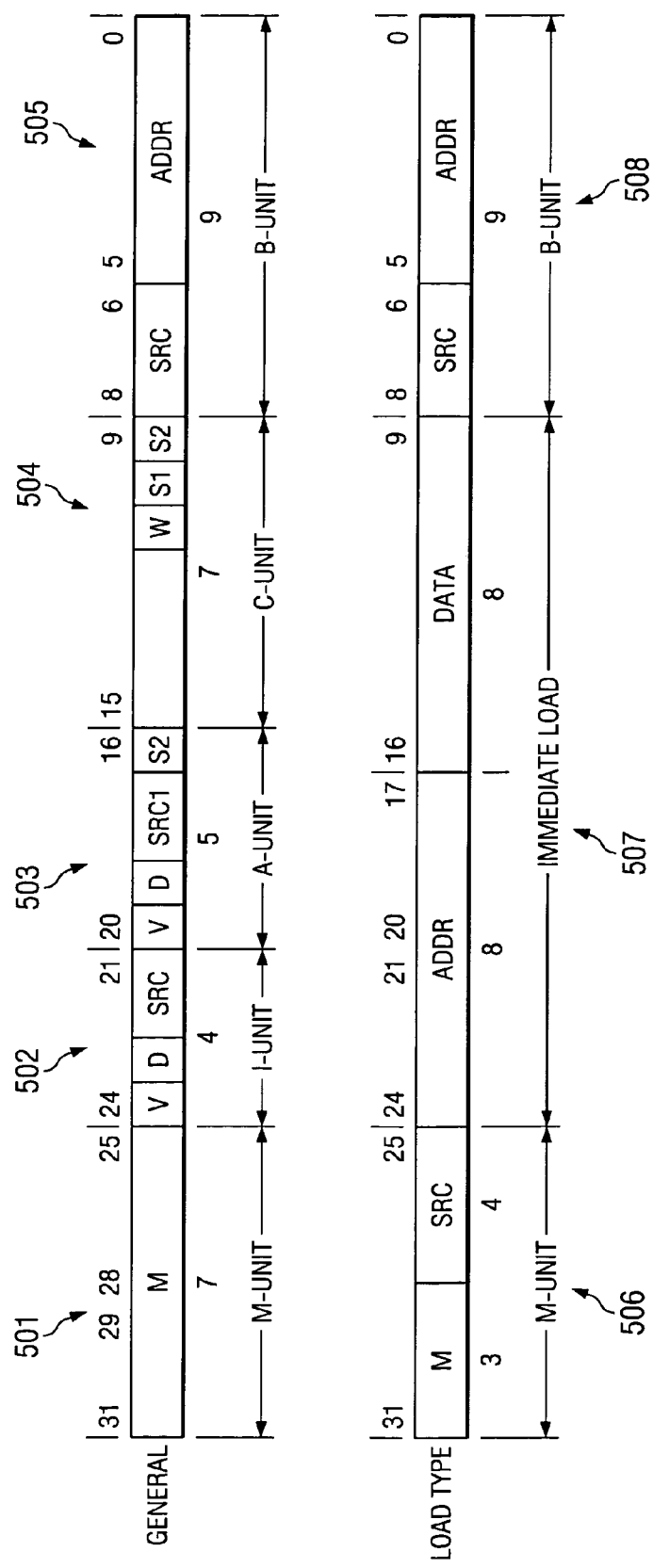
FIG. 5 illustrates the pBIST instruction types and opcode fields for general and load type instructions.

2. Programming RAM(s) specific requirements and memory testing algorithms. The current implementations (memBIST from Logic Vision and mBIST from Mentor) have the limitation that they must be programmed before tape-out. This assumes that the memory testing issues are all identified and bounded into a set of vectors before tape-out, which is almost always not true for process drivers. Most algorithms are based on the previous technology used in earlier devices. Designers often do not have a clear understanding of the current technology issues. As a result, the engineering evaluation effort often attempts to proceed using a CPU BIST, which of itself has a number of limitations. Back-to-back accesses are often impossible due to architectural limitations. As another example, if the L2 memory receives a burst inside a bank in current methodology pBIST provides a fast and thorough testing platform allowing this feature to be exercised.

pBIST supports two instruction types classified as general and load. The instruction width is 32-bits. The valid bit in the A-, I-, and C-, units can be combined with operation bits to expand the opcode if this provides the user additional features. The opcode formats for the M-, I-, A-, C-, and B-units are illustrated in FIG. 5 (501-505) general instructions. The second portion of FIG. 5 labeled 506-508 illustrates load-type instructions.

pBIST Utilizes the Following Processor Units:

The M-unit (Main Unit) handles the RAM read/write, program flow and load controls. It uses 7 bits of the pBIST opcode (see 501 and 506 in FIG. 5).

The I-unit (Increment/Decrement Unit) performs addition/subtraction on addresses A0, A1, L0 and L1 with an increment or decrement of 1. The I-unit uses a 4-bit opcode (see 502 of FIG. 5 and Table 1).

TABLE 1

| I-Unit Instructions | Valid | INCR/DECR | Source | |
|---|---|---|---|---|
| Operation Bits | 24 | 23 | 22 | 21 |
| INCREMENT L0 | 1 | 0 | 0 | 0 |
| INCREMENT L1 | 1 | 0 | 0 | 1 |
| INCREMENT A0 | 1 | 0 | 1 | 0 |
| INCREMENT A1 | 1 | 0 | 1 | 1 |
| DECREMENT L0 | 1 | 1 | 0 | 0 |
| DECREMENT L1 | 1 | 1 | 0 | 1 |
| DECREMENT A0 | 1 | 1 | 1 | 0 |
| DECREMENT A1 | 1 | 1 | 1 | 1 |
| NOP | 0 | X | X | X |

The A-unit (Addition/Subtraction Unit) performs 16-bit addition and/or subtraction on addresses A0, A1, L0, L1 with I0 and I1 increment sizes. The A-unit employs a 5-bit opcode (see 503 of FIG. 5 and Table 2).

TABLE 2

| A-Unit Instructions | Valid | ADD/SUB | SRC 1 | SRC 2 | |
|---|---|---|---|---|---|
| Operation Bits | 20 | 19 | 18 | 17 | 16 |
| ADD: A0 + L0 | 1 | 0 | 0 | 0 | 0 |
| ADD: A1 + L0 | 1 | 0 | 0 | 1 | 0 |
| ADD: I0 + L1 | 1 | 0 | 1 | 0 | 1 |
| ADD: I1 + L1 | 1 | 0 | 1 | 1 | 1 |
| SUB: A0 − L0 | 1 | 1 | 0 | 0 | 0 |
| SUB: A1 − L0 | 1 | 1 | 0 | 1 | 0 |
| SUB: I0 − L1 | 1 | 1 | 1 | 0 | 1 |
| SUB: I1 − L1 | 1 | 1 | 1 | 1 | 1 |
| NOP | 0 | X | X | X | X |

The C-unit (Combination Unit) performs shift/rotate/logic operation on addresses A0, A1, D1:D0, and constants E1:E0. The C-unit can support 16 or 32 bit operands and uses an 8-bit opcode (see 504 of FIG. 5 and Table 3).

TABLE 3

| C-Unit Instructions | | | | |
|---|---|---|---|---|
| Operation Bits | 14 | 13 | 12 | 11 |
| NOP | 0 | 0 | 0 | 0 |
| A = A AND B | 0 | 0 | 0 | 1 |
| A = A OR B | 0 | 0 | 1 | 0 |
| A = A XOR B | 0 | 0 | 1 | 1 |
| A = NOT A | 0 | 1 | 0 | 0 |
| A = NOT (A AND B) | 0 | 1 | 0 | 1 |
| A = NOT (A OR B) | 0 | 1 | 1 | 0 |
| A = NOT (A XOR B) | 0 | 1 | 1 | 1 |
| A = SHL A | 1 | 0 | 0 | 0 |
| A = ROTL A | 1 | 0 | 0 | 1 |
| A = SHRU A | 1 | 0 | 1 | 0 |
| A = ROTR A | 1 | 0 | 1 | 1 |
| A = NOT B | 1 | 1 | 0 | 0 |
| A = 0 | 1 | 1 | 0 | 1 |
| A = 1 | 1 | 1 | 1 | 0 |
| A = GRAY B | 1 | 1 | 1 | 1 |

The B-unit (Branch Unit) performs zero detection and branch decision logic. It uses an 8-bit opcode (see 505 and 508 of FIG. 5 and Table 4).

TABLE 4

B-Unit Instructions

| Operation Bits | 8 | 7 | 6 | 5:0 |
|---|---|---|---|---|
| BNZ L0 | 0 | 0 | 0 | ADDRESS |
| BNZ L1 | 0 | 0 | 1 | ADDRESS |
| BNZ A0 | 0 | 1 | 0 | ADDRESS |
| BNZ A1 | 0 | 1 | 1 | ADDRESS |
| BNZ FAIL | 1 | 0 | 0 | ADDRESS |
| BNZ REP | 1 | 0 | 1 | ADDRESS |

Figure 6:
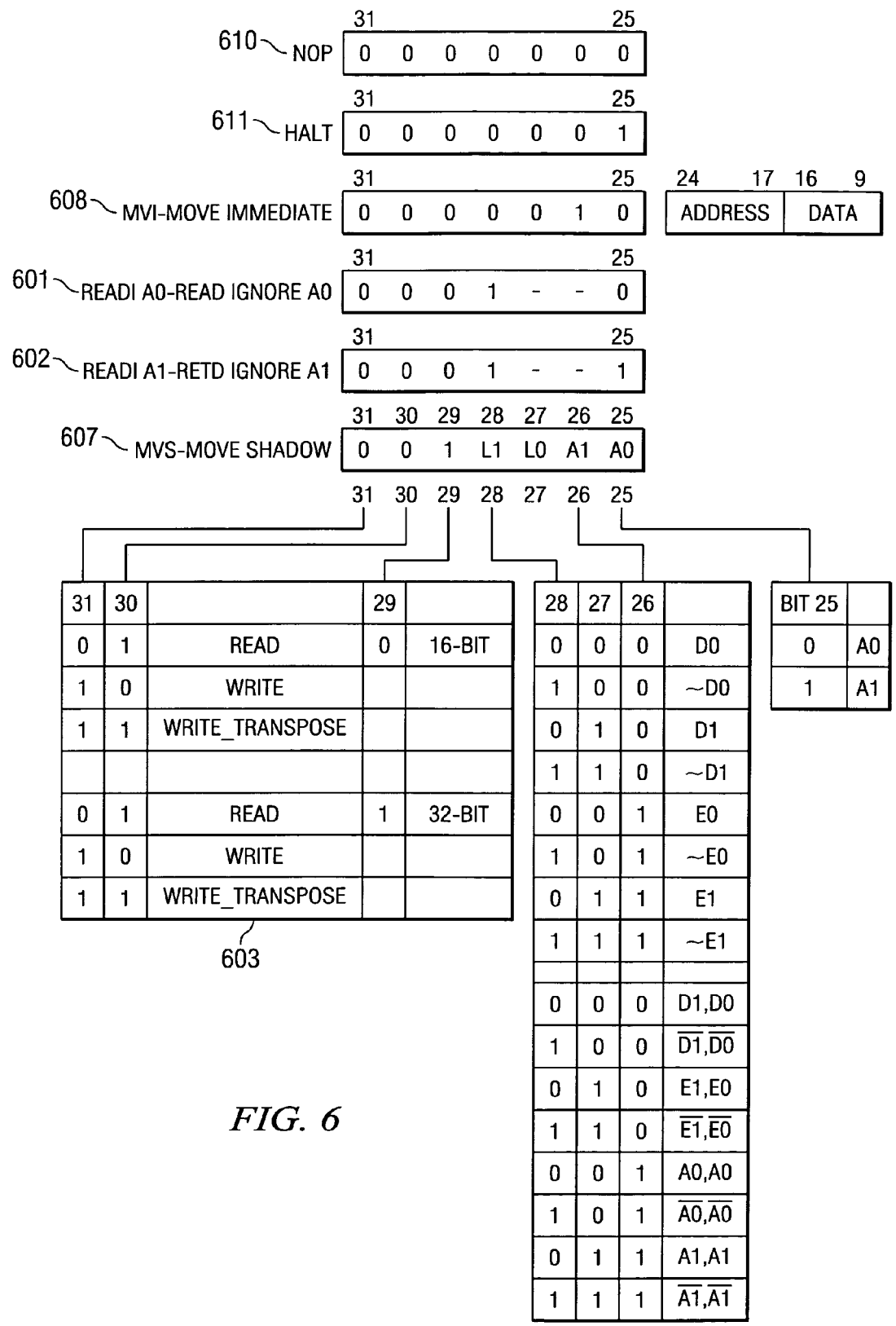
FIG. 6 illustrates the opcode details for the M-unit.

FIG. 6 illustrates M unit instructions in greater detail. For clarity these M unit instructions may be broken down into the following major types.

(1) READ—This instruction reads the memory under test. It has two major variations and other possibly useful ones are available. The return data may be compared with an expected value. If a mismatch occurs the pBIST controller may stop or log and continue based on the setup. Also this option can be disabled. Its variations are: Read 603, Read without compare, and Sub-Width Reads 601 and 602 with or without compare.

(2) WRITE—This instruction writes to the memory. The return data may or may not be compared. Variations are: (a) Write, (b) Write with return data compared, (c) write-through with return data compared and (d) write modified read with return data compared (see 603 of FIG. 6).

(3) NOP—This instruction does nothing as its name suggests. It is used to perform internal activities internal to the pBIST controller or to add a delay slot (see 610 of FIG. 6).

(4) LOAD—The LOAD instructions are of two types: (a) move shadow (MVS) and move immediate (MVI) opcodes used are illustrated in FIG. 6).

(5) Move Shadow (MVS) instruction performs register loading inside the pBIST. All registers enabled get loaded with their shadow value. The MVS instruction operand has three options (see 607 of FIG. 6):

1) Load all registers with shadow
2) Load only enabled registers with shadow
3) Load none of the registers (6) MVI (Move Immediate) instruction acts as a Load Immediate which loads the data to the byte pointed to by the address See 608 of FIG. 6).

(7) HALT—On this instruction the execution stops and the CPU is not modified. Data logging stops after a delay of N clock cycles where N is the number of pipeline stages in the pBIST controller (see 611 of FIG. 6).

A summary of processing in other microcontroller processing units follows.

The I-unit increments or decrements either L0, L1, A0 or A1 according to the code 502 in FIG. 5. Bit 20 is a valid bit allowing enabling or disabling of the increment operation.

The A-unit adds or subtracts combinations of sources from registers L0, L1, A0 or A1 according to the code 503 in FIG. 5. Bit 20 is a valid bit allowing enabling or disabling of the addition/subtraction operation.

The C-unit performs shift/rotate/logic operation on A0, A1, D1:D0, and E1:E0 according to the code 504 of FIG. 5. The C-unit can support 16 or 32 bit operands.

The B-unit performs branching as follows. The program counter (PC) takes the address pointed to by the instruction. If the valid bit is active, then the LOOP count [A0, A1, L0, or L1] if zero will transfer the program counter content to address+1. If the LOOP count is not zero the branch is taken.

Address Scrambling

Address scrambling registers SCR0 and SCR1 are a feature of pBIST that is available through the M-unit and is illustrated by M-unit address scrambler 461 of FIG. 4. Incorrect address connections detected after the device has been submitted for tape-out do not allow the correct operation of the algorithms developed. Address scrambling is a technique by which the programmer can correct the address problem. The address scrambler provides a one-to-one connection for all 16-bits of A0 and A1 to the RAMs. The default value of the SCR register at reset is: SCR[63:0]=hexadecimal FEDCBA9876543210. By modifying these values any address mapping may be achieved. As an example consider the case wherein the address values 8 and 7 are reversed. The programmer needs merely to modify the SCR to become: SCR[63:0]=hexadecimal FEDCBA9786543210. With this change the memory map can be properly accessed as the algorithm intended. Address scrambling has two dedicated memory-mapped registers listed in Table 5 under addresses 00D0 and 00D4.

Configuration Registers

There are five configuration registers in pBIST included in programming logic interface configuration registers 470 of FIG. 4. These registers and the configuration options they select are:

(1) Clock Multiplexer Select (CMS): selects between (a) test clock, (b) base maximum frequency CPU clock, and clock domains (c) half-frequency clock, clock2, and (d) one fourth frequency clock, clock4. CMS is listed with memory-mapped registers under address 00C8 in Table 5

(2) Sense Margin Select (SMS): selects between (a) slow functional, (b) test slow, (c) fast functional, and (d) test fast.

(3) Pipeline Latency Select (PLS): selects between 0 through 15 cycle latency for comparison of data from RAM interface with expected data. The data logger employs optional pipeline register stages that may be configured for this range of latency.

(4) RAM Latency Select: pBIST supports four RAM latency selections: 0, 1, 2, or 3 clock cycles. The pBIST controller sends one access for every N cycles. This is necessary for RAMs, which are clocked at a higher frequency to reduce latency. Pipeline latency is the sum of the datapath latency plus the RAM latency. The programmer must assure that the expected data arrives after the programmed delay. This register is part of the RAMT register which includes (1) RGS; (2) RDS; (3) Data Width; (4) Pipe Latency; and (5) RAM Data.

(5) Chip Select CSR: pBIST implements a chip select for up to 32 RAMs. When a READ or WRITE command is executed, the corresponding chip select is driven active and enables the selected RAM. Chip select (CSR) is listed with memory-mapped registers under address 00D8 in Table 5

(6) Program Control Register STR[4:0]: this register is five bits wide as listed under address 00CC with memory-mapped registers in Table 5. Each bit is an active high enable for program control features.

STR(0) pBIST Start. Begins testing after pBIST has been enabled.

STR(0) Resume Testing. STR(1) going high resumes execution after an error is detected. When pBIST detects an error, it will log a fail signature. Using the configuration bus the programmer reads the status register and can resume operation. If only one error is detected, pBIST continues execution and will ignore the resume code occurrence. If a second error is detected, pBIST will stall. The second failure will be loaded to the failure signature registers. These fail signature registers include FSRF, FSRC, FSRA, and FSRD included in memory-mapped register list in Table 5 under addresses 00F0, 00f4, 00f8, and 00FC respectively. Assume after a resume operation that a fail is encountered and a second interrupt is issued. When a configuration bus read of the second failure is completed, the pBIST will continue operation.

STR(2) Stop Testing. Stop operation bit acts to stop execution of the memory testing for any assigned reason.

STR(3) Step Testing. In step test mode the test engineer may execute one instruction and stop for a time to review the results and then proceed one test at a time if desired.

STR(4) Enables pBIST. Enable mode selects the pBIST controller if multiple controllers are supported. Cycle begins by resetting the CPU and starting execution from the initialized state.

(7) Data Width Register DWR[7:0] is part of RAMT register: This register is used to decide the data width to the RAMs. The value DWR represents the data width of the RAM. The decoded bits that are enabled will be compared for return data with the constant data registers selected. RAMT is listed in Table 5 of the memory-mapped registers under address 00C0.

(8) Column Mask Register [31:0] (Internal, not a memory mapped register): In the column mask mode, this register stores the multiple bit fails within a column and masks this column from the next column fail detect. This allows detection of a failed column but excludes multiple failures within a given column from triggering unnecessary failures.

(9) Time Stamp and Time Stamp Fail Mask Registers [31:0] (Internal, not memory mapped): These registers are enabled in the time stamp mask mode when it is useful to skip all instructions until the previous failure and then enable failure logging. This preserves the algorithms intended operation.

(10) Data Logger Control Register [7:0] DLR: The data logger is controlled from this 8-bit register as listed under address 00C4 with memory-mapped registers in Table 5. DLR(7:3) are active high enables for data logger features. The remaining bits DLR(2:0) are reserved for added further functions.

DLR(7) activates time stamping;
DLR(6) activates column fail masking;
DLR(5) activates stream mode;
DLR(4) activates configuration inputs;
DLR(3) activates TCK gated mode.
DLR(2) reserved.
DLR(1) reserved.
DLR(0) reserved.

(11) RAM Group Select [15:8] (RGS, part of RAMT register): In order to support more than 32 RAMs this RAM group select register has been provided. This extends the total number of RAMs that can be tested from 32 to 8192 RAMs of 32 bits or less. RAMs with data width larger than 32 are tested as more than one RAM and data logged separately.

(12) Return Data Register RDS 31:16, is part of RAMT register.

Status Outputs and Fail Status Registers

There are three status outputs from the pBIST output unit 326 that are included in status 330. These are (1) Done and (2) Run signals generated in micro-code program control 313, and (3) fail, generated in the output unit 326 from the flag (FSRF) signal in the status register 338. Fail Status Registers 338 of the pBIST output unit 326 includes four registers: (1) FSRF (fail flag); (2) FSRC (fail count); (3) FSRA (fail address) and (4) FSRD (fail data).

(1) Fail Flag Register FSRF[0]. This one bit register is cleared at reset and when start or pBIST_enable is activated. This I-bit register represents the failure status of the current execution phase at that point. It is driven high the moment the data logger makes a negative compare. It is also connected to the pBIST_fail output bit of the pBIST controller. Memory-Mapped address is 00F0 in Table 5.

(2) Fail Count Register FSRC [7:0]. This register is cleared at reset and when start or pBIST_enable is activated. This 8-bit register represents the failure count of the current execution phase at that point.

(3) Fail Address Register FSRA [15:0]: This register stores the event of a negative compare on address when the finite state machine signal FSR is logical 1. Memory-Mapped address is 00F8 in Table 5.

(4) Fail Data Register FSRD [31:0]: This logout register stores the compare status by data width. It is valid only when Fail Status Register is a logical 1. The register is cleared during reset or when start or PBIST_enable is activated. When a failure is detected, the pBIST controller stops immediately and, based on the mode selected, either scans the failure out, broadcasts it to the I/O pins or waits for the user to read it out before continuing. If the user mode is selected, then the Restart register must be toggled to continue. The Compare Status register and Address register are valid only if data logging is enabled. Memory-Mapped address of FSRD is 00FC in Table 5.

Memory Mapped Registers

All pBIST registers of interest to the user are memory mapped to be accessible from Tester IF 406 or CPU IF 407. The CPU interface is for parallel accesses and usually for speed. Scan based initialization is also available. The memory mapping of all the pBIST internal registers is described below. A full listing of memory mapped registers, addresses and contents is illustrated in Table 5.

TABLE 5

| Address (hex) | Register | Description | Bits 31:24 | Bits 23:16 | Bits 15:8 | Bits 7:0 |
|---|---|---|---|---|---|---|
| 0000 | RF0 | Register | RF0 | RF0 | RF0 | RF0 |
| 003C | RF15 | File | RF15 | RF15 | RF15 | RF15 |
| 004C | RF16 | — | RF16 | RF16 | RF16 | RF16 |
| 007C | RF31 | Expansion | RF31 | RF31 | RF31 | RF31 |
| 0080 | A0 | Address | | | A0 | A0 |
| 0084 | A1 | Address | | | A1 | A1 |
| 0088 | L0 | Variable | | | L0 | L0 |
| 008C | L1 | Variable | | | L1 | L1 |
| | | Shadow Registers | | | | |
| 0090 | D1:D0 | Constant | D1 | D1 | D0 | D0 |
| 0094 | E1:E0 | Constant | E1 | E1 | E0 | E0 |
| 00A0 | CA0 | Constant | | | CA0 | CA0 |
| 00A4 | CA1 | Constant | | | CA1 | CA1 |
| 00A8 | CL0 | Loop Count | | | CL0 | CL0 |
| 00AC | CL1 | Loop Count | | | CL1 | CL1 |
| 00B0 | I0 | Increment | | | I0 | I0 |
| 00B4 | I1 | Increment | | | I1 | I1 |
| 00C0 | RAMT | RAM Info | RDS 31:24 | RDS 23:16 | RGS 15:8 | DWR 7:0 |
| 00C4 | DLRT | Data Logger Mode | | | | DLRT 7:0 |
| 00C8 | CMS | Clock Mux Select | | | | CMS 1:0 |
| 00CC | STR | Program Control | | | | STR 4:0 |

TABLE 5-continued

| Address (hex) | Register | Description | Bits 31:24 | Bits 23:16 | Bits 15:8 | Bits 7:0 |
|---|---|---|---|---|---|---|
| 00D0 | SCR0 | Address Scramble Chip Select | SCR0 | SCR0 | SCR0 | SCR0 |
| 00D4 | SCR1 | | SCR1 | SCR1 | SCR1 | SCR1 |
| 00D8 | CSR | | CSR | CSR | CSR | CSR |
| Fail Status | | | | | | |
| 00F0 | FSRF | Fail Flag | | | | Flag bit0 |
| 00F4 | FSRC | Fail Count | | | | Count 7:0 |
| 00F8 | FSRA | Fail Addr | | | FSRA | FSRA |
| 00FC | FSRD | Fail Data | FSRD | FSRD | FSRD | FSRD |

Configuration Bus Interface

In the configuration mode, the programmer has complete flexibility on how to test and debug the pBIST operations. With the interrupt handshake between the CPU and pBIST controller, the programmer can test any memory in the chip and does not have to be concerned with any particular RAM. For example, in a current design using CPU BIST when testing the L1I RAM or TAG, the programmer needs to be concerned as to what memory is being tested and how to run the program without the memory testing interfering with the CPU operation. By contrast using pBIST mode the programmer can run the code, setup the pBIST controller and go into IDLE and when the interrupt occurs, the programmer codes the interrupt handler such that no bad code is executed.

The operations performed are as follows:
1. Setup the pBIST controller.
2. Before start all functional memories/register files that will be tested by pBIST must be set in bypass mode. Any memory content modified by pBIST for testing purposes should not impact normal pBIST testing sequences.
3. Start pBIST.
4. CPU goes into IDLE mode.
5. pBIST Testing in progress. pBIST interrupts CPU on failure.
6. CPU Interrupt routine is initiated with two possible options.
   A. Check failure status, make code modifications to work around failure and restart pBIST.
   B. Interrupt routine is non-cacheable or L1I is turned off.

Programming Logic Interface

The programming logic interface (PLI), 470 of FIG. 4, is necessary to avoid RAM testing dependence on CPU functionality. Using the PLI, pBIST initialization and operation is controlled from outside the chip. Only the pBIST logic functionality is necessary for performing RAM testing.

The steps involved PLI interface testing are:
1. Enable pBIST test mode.
2. Initialize pBIST controller.
3. Load program.
4. Start testing
5. pBIST controller starts RAM testing.
6. Failure will log status and scan it out at TCK frequency
7. Testing continues until multiple failure and then will run lock step with data logging and scan-out.
8. Program completion triggers the done signal and PASS/FAIL signature is output.

Micro Architecture (Repairable RAMS)

Repairable RAMS require multiple fail data logging for row/column error correction. In this mode there are a number of options. These tests can be run via CPU IF or PLI interfaces. In the configuration bus interface CPU interrupts or time-out modes are supported. The programmer starts the pBIST controller. The pBIST controller runs until it captures a failure. The CPU can start the testing on pBIST and go into IDLE mode. The pBIST controller activates the interrupt both on failures and on end of test. When interrupted, the CPU can then read the fail status registers and determine the next step. The pBIST controller is stalled when a second failure happens. The CPU writes a logical 1 to the resume bit to continue to the next failure.

Figure 7:
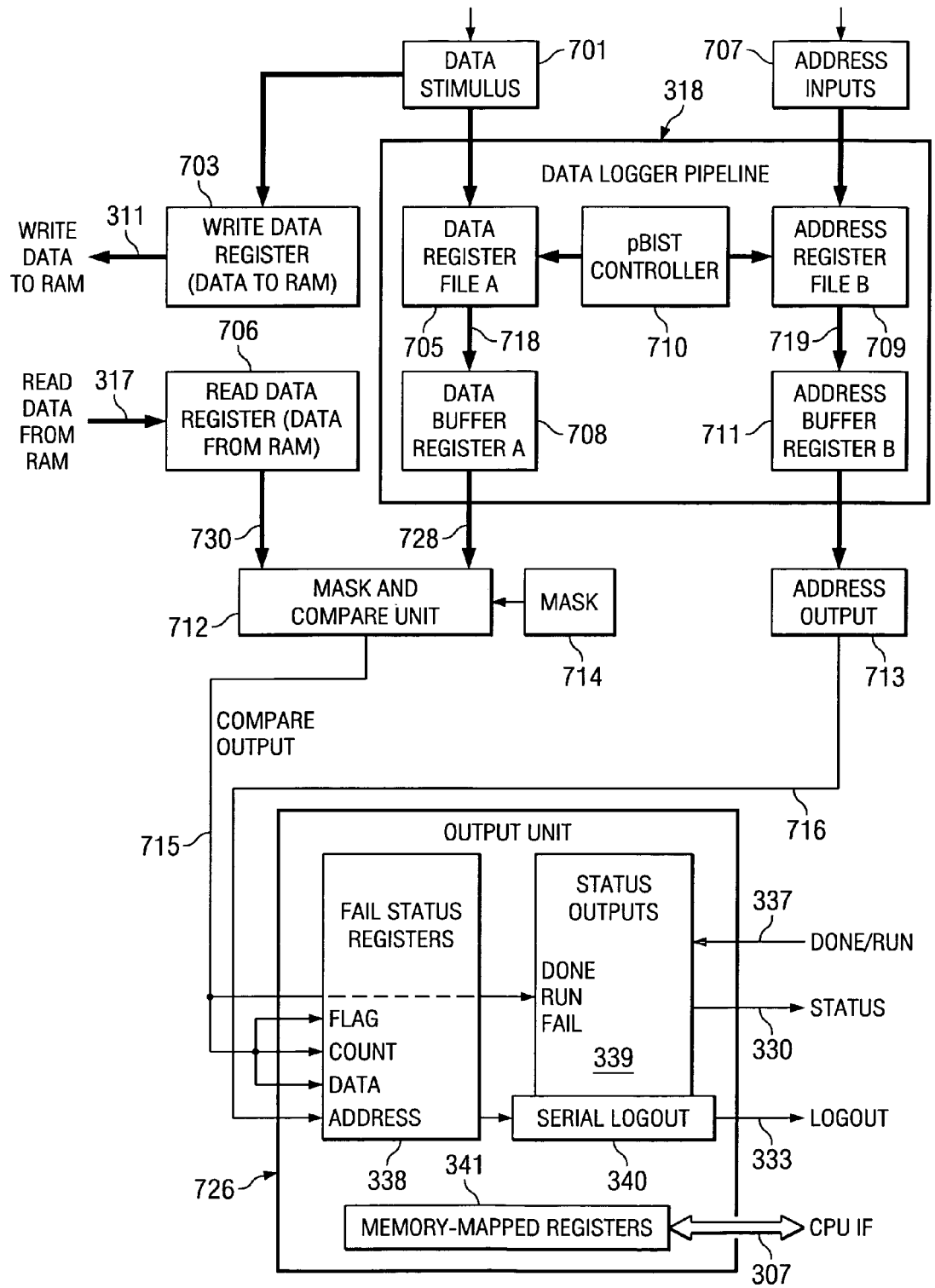
FIG. 7 illustrates the basic data logger structure.
Figure 8:
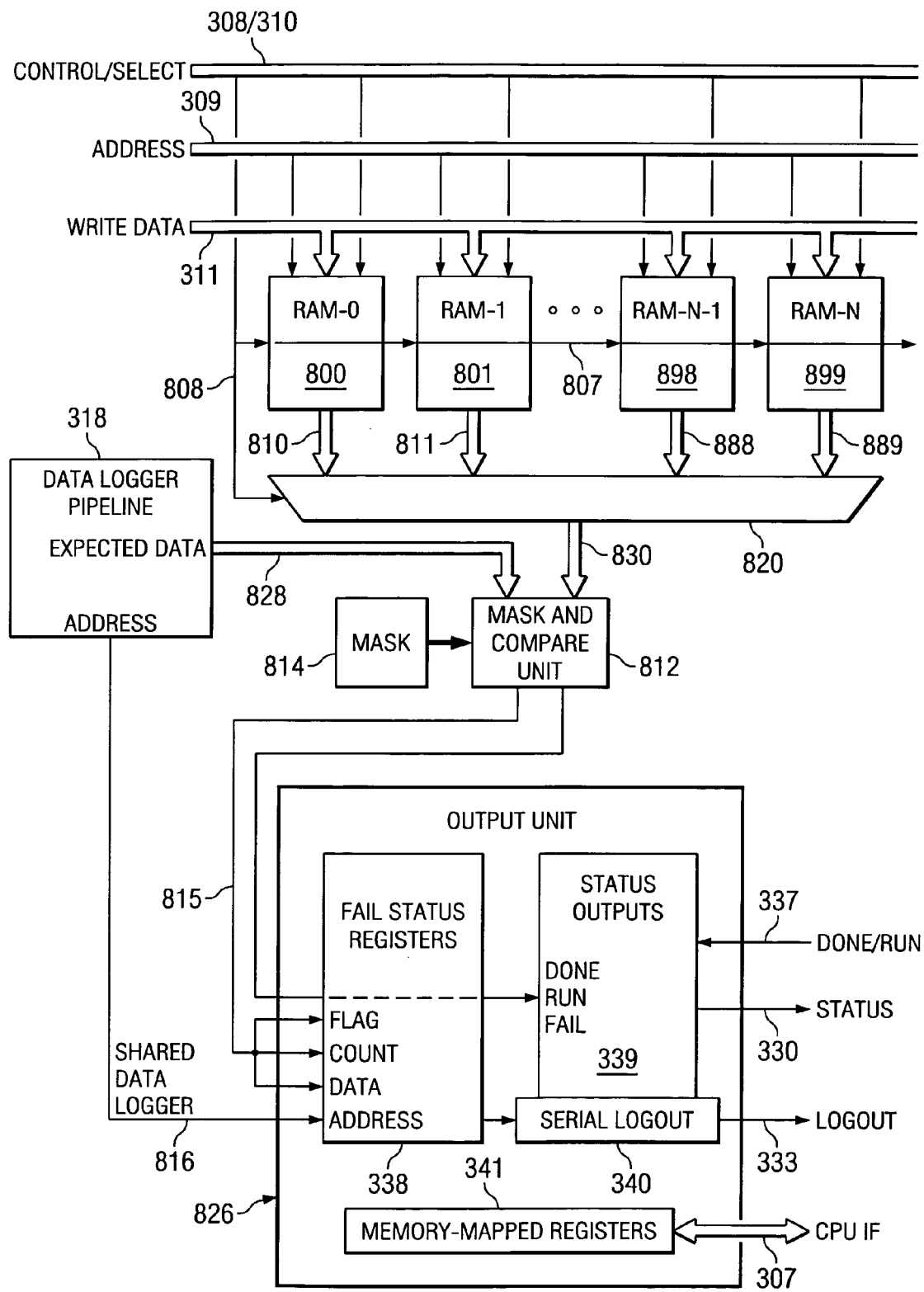
FIG. 8 illustrates the shared data logger structure.

FIG. 7 illustrates the structure of a basic data logger function. The pBIST data logger includes three parallel pipelines passing address and data information in-step to preserve latency timing. Data stimulus 701 for the RAM under test is sent to two parallel registers. Register 703 is the data path to the RAM under test and data register file A 705 preserves a copy for test comparison. Address enters at address inputs 707 and enters address register file B 709. As read data from the RAM under test returns at 317 it is stored in read data register 706. At the same clock time, registers 706, 708, and 711 are clocked to receive actual data 317, expected data 718 and corresponding address value 719. Data 317 and 718 as stored in registers 706 and 708 respectively are submitted to mask and compare unit 712. Mask inputs are provided by mask 714 and mask and compare unit output 715 is sent to pBIST data logger output unit 726 for processing into outputs 330 and 333 as described in FIG. 3. Corresponding address information 716 is passed from address output stage 713 to data logger output unit registers to be matched to compare output 715 for presentation of output results. Memory mapped registers 341 hold all fail status information including Fail, Fail Count, Fail Data, and Fail Address as stored in the fail status registers 338. This information is accessible at the CPU IF 307. An interrupt is also sent to the CPU via CPU IF 307. Serial logout 340 allows passage of the same information to the user at logout 333. Status outputs 330 from block 339 include Done and Run which are derived from the program control 313 at input 337 and the Fail output derived from mask and compare output 715.

pBIST provides additional RAM datapath interface options with improved throughput. Two possible designs include the shared data logger and the distributed data logger. The shared data logger structure illustrated in FIG. 8 has a relatively simple implementation and requires minimal additional hardware. The shared data logger uses the data logger pipeline 318 described in FIG. 3 and FIG. 7 and multiple RAMs connected and driven from busses 308, 309, 310 and 311. In FIG. 8 the RAM return data from all RAMS 800 through 899 passes to multiplexer 820 via paths 810, 811, 888, 889 for return to the pBIST data logger mask and compare unit 812 via 830. Compare results may be masked in the mask and compare unit 812 using mask 814 before being passed to the pBIST data logger output unit 826. Mask features include: (a) data width, (b) column fail, and (c) time stamp. Expected Data 828 and Address 816 are supplied by the data logger pipeline 318. Data Logger Outputs include: Done, Fail, and Run status outputs 330 and Logout 333. The CPU IF 307 interfaces with the memory mapped registers 341. The data logger output unit 326 includes the fail status registers 338, status output logic 339, the memory mapped registers 341, and serial logout via serial logout 340.

The advantage of the shared data logger is that the designer needs merely to route and multiplex down the RAM return data and bring it back to the pBIST. The pBIST controller (710 of FIG. 7) takes care of data logging and stalling on fails.

Figure 9:
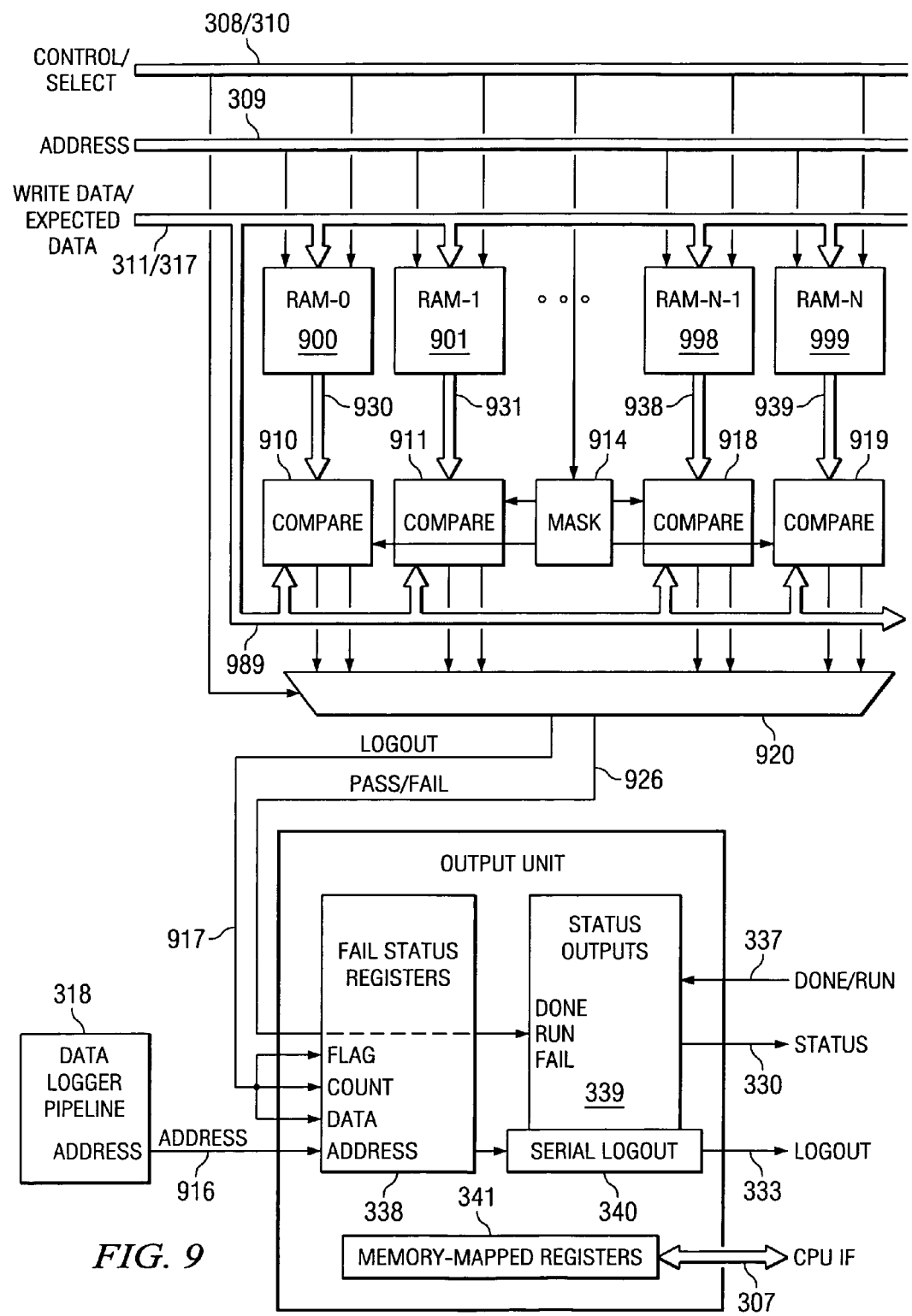
FIG. 9 illustrates the distributed data logger structure.

FIG. 9 illustrates the distributed data logger in which data logging is done at the individual RAM locations. The distributed data logger also uses the data logger pipeline 318 described in FIG. 3 and FIG. 7 and multiple RAMs connected and driven from busses 308, 309, 310 and 311 as well as expected data from bus 317. The RAMs are illustrated as 900, 901, 998, and 999. Compare blocks 910, 911, 918 and 919 perform the same mask and compare described earlier with masking coming from mask 914. The logic for compare of the return data 930,931, 938, 939 with the expected data 989 is placed at the RAM output and two signals are retrieved from the individual RAMs. These are Pass/Fail 926 and logout 917. Address 916 is supplied by the data logger pipeline 318. Data Logger Outputs include: Done, Fail, and Run status outputs 330 and Logout 333. The CPU IF 307 interfaces with the memory mapped registers 341. The data logger output unit 326 includes the fail status registers 338, status output logic 339, the memory mapped registers 341, and serial logout via serial logout 340. The distributed data logger option allows parallel testing of RAMs but requires additional replicated logic at the RAMs.

Time Stamping Mask Mode

In the absence of a time stamping mask, failures that occur cause the pBIST controller to cease testing, process the failure, and continue testing from the point where the testing had ceased. Then when the testing operation is continued, back-to-back testing has been interrupted and hidden failures may result. Time Stamp Mask Mode operation remedies this difficulty. Using the time stamp fail mask pBIST saves the time stamp of the last failure and generates a TS fail mask.

Figure 10:
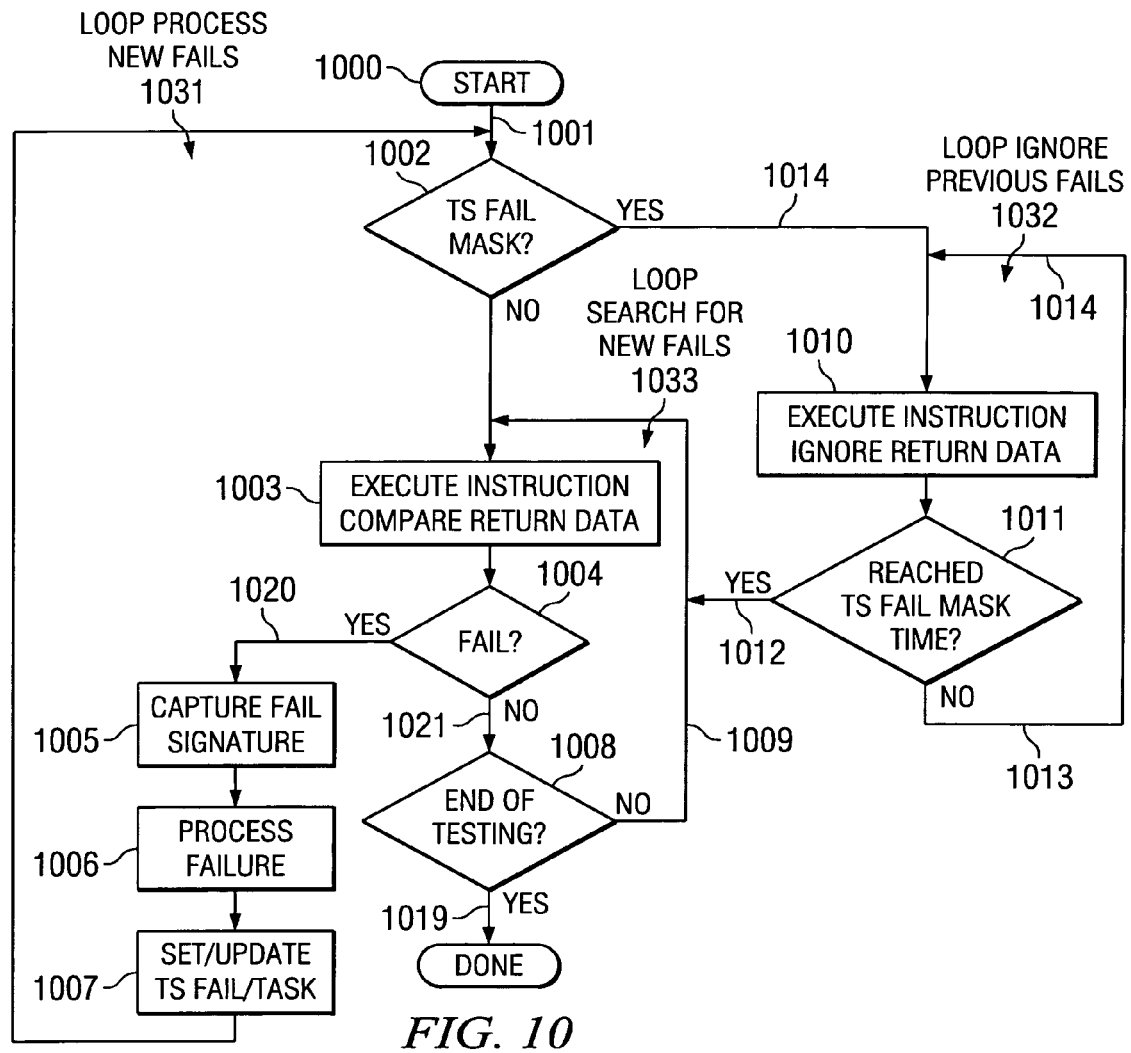
FIG. 10 illustrates the time stamp mode program flow chart.

FIG. 10 illustrates the pBIST time stamp mask mode operation. Assume the user initiates the start of testing in the time stamp mask mode. The pBIST controller begins at start block 1000 and because no failures have yet occurred, it bypasses error checking at the TS fail mask block 1002 where only an existing TS fail mask record would cause ignoring of previously processed fails. The pBIST controller then executes an instruction and captures and compares return data in block 1003. If test 1004 detects a fail (a Y result) the path 1020 into a return loop 1031 is taken. Loop 1031 can be referred to as the process new fails loop. If test 1004 results in a pass (a N result), another test is performed in block 1008 to determine whether end of testing has occurred. If end of testing has not been reached, the path 1009 back to the start of loop 1033 is taken. Loop 1033 can be referred to as the search for new fails loop. If end of testing has been reached in test 1008 path 1019 is taken to a done state.

The steps in return loop 1031 are (a) to capture the fail signature 1005, (b) process the fail information 1006 and (c) set TS fail mask as the time of failure in block 1007. Fail information is processed by: (1) logging a fail at output 331 of the data logger (FIG. 7) and (2) passing the fail signature through data logout 333 of FIG. 7. The fail signature is stored in memory mapped registers within the pBIST data logger 716 and may passed to the CPU IF as an alternative means of outputting fail signature data. Once this is accomplished and the time stamp recording of the TS fail mask time of block 1007 has been completed, testing returns to the loop 1031 return point 1001 where the attempt to capture a fail mask in block 1002 is re-initiated. The updated TS fail mask information from block 1007 is then used to perform later occurring tests in block 1002.

A positive result in block 1002 results in an exit to loop 1032 where instructions are executed but return data is ignored in block 1010. Loop 1032 can be referred to as the ignore previous fails loop. Query on whether TS fail mask time has been reached is performed in block 1011. A positive result causes entry via 1012 into loop 1033 to search for new fails; a negative result in block 1011 continues loop 1032 via path 1013 and previous fails are ignored until TS fail mask time is reached in test 1011.

On entering loop 1033 the next instruction is executed and return data is compared to expected results in block 1003. A fail in block 1004 causes a return to loop 1031. No fail in block 1004 leads to end of testing query in block 1008. If the testing is not ended path 1009 is taken with the continuing of loop 1033 and the search for new fails. Data logging is enabled and testing continues. At the end of the test 1019 the result is that all failures were detected only once and the expected testing operation of the algorithm is achieved in the done state.

pBIST programming for specific testing is based on knowledge of the structure and operation of the RAM to be tested. The row-column structure of a typical RAM and the addressing, write operations, and read operations collectively give the task of testing clear initial direction. Test sequences that generate interactions between cells or rows or columns can be used to verify the robustness of the design or the topology of the RAM layout. Test sequences that force stores bits in the RAM alternately from '1' to '0' and back to '1' exercise worst cases involving sense amplifier operation are another common means used to identify weakness in the design or layout.

An extremely large effort to address these test cases has resulted in sophisticated algorithms being developed for almost any RAM design weaknesses that have been identified in the past or expected as new designs place pressure on the parameters of the fabrication process. The capability to develop these algorithms is clearly useful to complete testing of new designs in wafer form using pBIST. Once the device has been fabricated, pBIST testing can be applied to exercising even the most extreme states that a design can encounter. If any weaknesses are uncovered, then the programmability features of pBIST allow for tracking RAM failures in even unrealistically extreme operating conditions.

The full width testing sequence illustrates a simple example of pBIST programming. The code and a line-by-line description of the code is illustrated below.

| Full Width Testing Algorithm | | | |
|---|---|---|---|
| * INIT | Involves Two Steps: | | |
| * Load CL0 with M−1; Load CA0 with hex '0' | | | |
| * Load D1:D0 with hex:0. | | | |
| * Initialize all RAM bits to 0 by looping from 0 to (N−1) | | | |
| Address | Mnemonics | | |
| LINE NUMBER | | | |
| 1100 | .M MVS | A0, L0 | |
| 1101 LOOP1: | .M WRITE | A0, D1: D0 | |
| 1102 | | .A ADD | A0, I0 | |
| 1103 | | .I DEC | L0 | |
| 1104 | | .B BNZ | L0 | LOOP1 |
| * LOAD | Re-initialize Address and Loop Count | | |
| * | for "Read-Write-Read" Loop | | |
| 1105 | .M MVS | A0, L0 | |
| * TEST | | | |
| * Read zeros, Write ones, Read ones on address 0 to N−1 | | | |
| 1106 LOOP2: | .M READ | A0, D1:D0 | |
| 1107 | .M WRITE | A0, ~D1:D0 | |
| 1108 | .M READ | A0, ~D1:D0 | |
| 1109 | | .A ADD | A0, I0 | |
| 1110 | | .I DEC | L0 | |

-continued

Full Width Testing Algorithm

| 1111 | \|.B BNZ | L0 | LOOP2 |
| --- | --- | --- | --- |
| * HALT | | | |
| * Test Complete | | | |
| 1113 | \|.M HALT | | |

Comments by Line Number:
1100: Move Shadow MVS moves CA0 to A0 and CL0 to L0
1101: Start of LOOP1:
  WRITE M-instruction writes address A0 into concatenated registers D1:D0.
  Three parallel operations in lines 1102, 1103, and 1104 follow.
1102: ADD A-operation adds I0 to A0 and places result into register A0.
1103: DEC I-operation decrements register L0.
1104: Branch B-operation branches to LOOP1 if L0 has been decremented to zero in line 1103.
1105: Move Shadow MVS moves CA0 to A0 and CL0 to L0
1106: READ M-instruction reads from address A0 the concatenated registers D1:D0.
1107: WRITE M-instruction writes to address A0 the inverted bits ~(D1:D0); tilde indicates all bits inverted.
1108: READ M-instruction reads from address A0 the previously written data ~(D1:D0).
1109: ADD A-operation adds I0 to A0 and places result into register A0.
1110: DEC I-instruction decrements L0 register.
1111: Branch B-operation branches to LOOP2 if L0 has been decremented to zero in line 1110.
1112: HALT Ends testing.

What is claimed is:

1. A data processor system comprising:
   at least one read/write memory;
   a programmable memory test controller operable to perform a sequence of memory test operations according to an alterable set of instructions,
   said programmable memory test controller including a plurality of special functional units of differing types each controlled by a corresponding part of said instructions; and
   a results logger operable to compare data read from said at least one read/write memory with expected results.

2. The data processor system of claim 1, further comprising:
   a set of data registers including at least one data register operable to store data to be written to said at least one read/write memory; and
   wherein said plural special functional units include an arithmetic unit operable to selectively add or subtract data stored in said data registers.

3. A data processor system comprising:
   a plurality of read/write memories;
   a programmable memory test controller operable to perform a sequence of memory test operations according to an alterable set of instructions;
   a results logger operable to compare data read from said at least one read/write memory with expected results, said results logger including
   a multiplexer having a plurality of inputs, each input receives read data from a corresponding one of said plurality of read/write memories, said
   multiplexer further having a control input and an output, said multiplexer coupled to a selected one of said plurality of inputs to said output dependent upon said control signal, and
   a comparator connected to said output of said multiplexer operable to compare data from said read/write memory selected by said multiplexer with corresponding expected results.

4. A data processor system comprising:
   a plurality of read/write memories; a programmable memory test controller operable to perform a sequence of memory test operations according to an alterable set of instructions; and
   a results logger operable to compare data read from said at least one read/write memory with expected results,
   said results logger including a time stamp register operable to store a time stamp upon detection of a mismatch of said data read from said at least one read/write memory with said expected results, and
   said results logger operable in a time stamp mask mode to indicate a match when an elapsed time of a current test is less than or equal to said time stamp stored in said time stamp register, whereby said data processing system is operable to re-execute a sequence of memory test operations from a start and ignore previously detected mismatches.

5. A data processor system comprising: at least one read/write memory;
   a programmable memory test controller operable to perform a sequence of memory test operations according to an alternate set of instructions; and
   a result logger operable to compare data read from said at least one read/write memory with expected results, said results logger operable to stop said sequence of memory test operations upon detection of a mismatch between data read from said at least one read/write memory and said expected results, and
   resume said sequence of memory test operations upon receipt of a resume command.

* * * * *